(12) United States Patent
Jeong

(10) Patent No.: US 7,009,301 B2
(45) Date of Patent: Mar. 7, 2006

(54) SEMICONDUCTOR PACKAGE WITH A HEAT SPREADER

(75) Inventor: Nyeon-Sik Jeong, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 206 days.

(21) Appl. No.: 10/751,175

(22) Filed: Dec. 30, 2003

(65) Prior Publication Data

US 2004/0156173 A1    Aug. 12, 2004

(30) Foreign Application Priority Data

Dec. 30, 2002  (KR)  ................. 10-2002-0086410

(51) Int. Cl.
- H01L 23/48 (2006.01)
- H01L 23/52 (2006.01)
- H01L 23/34 (2006.01)
- H01L 23/495 (2006.01)
- H01L 23/28 (2006.01)

(52) U.S. Cl. ............... 257/777; 257/712; 257/675; 257/796

(58) Field of Classification Search ........ 257/705–707, 257/712, 718–720, 673, 675, 777, 796
See application file for complete search history.

(56) References Cited

U.S. PATENT DOCUMENTS

| | | | |
|---|---|---|---|
| 6,566,760 B1 * | 5/2003 | Kawamura et al. | 257/777 |
| 6,781,241 B1 * | 8/2004 | Nishimura et al. | 257/777 |
| 6,927,497 B1 * | 8/2005 | Meyers | 257/777 |
| 2001/0000053 A1 * | 3/2001 | Suh et al. | 257/686 |
| 2002/0079567 A1 * | 6/2002 | Lo et al. | 257/685 |
| 2002/0130398 A1 * | 9/2002 | Huang | 257/666 |
| 2002/0180058 A1 * | 12/2002 | Uchida | 257/777 |
| 2002/0185734 A1 * | 12/2002 | Zhao et al. | 257/737 |
| 2004/0119153 A1 * | 6/2004 | Karnezos | 257/686 |
| 2004/0196635 A1 * | 10/2004 | Park et al. | 361/707 |

* cited by examiner

*Primary Examiner*—Shouxiang Hu
(74) *Attorney, Agent, or Firm*—Andrew D. Fortney

(57) ABSTRACT

A semiconductor package capable of spreading heat includes an upper PCB and a lower PCB connected to a first chip and a second chip by using gold bumps, respectively. Also the semiconductor package includes a heat spreader and thermally conductive members. The heat spreader spreads the heat generated by the first chip and the second chip. The thermally conductive members transmit the heat to the heat spreader by connecting the heat spreader to the first chip and the second chip with the thermally conductive members.

10 Claims, 1 Drawing Sheet

SEMICONDUCTOR PACKAGE WITH A HEAT SPREADER

FIELD OF THE INVENTION

The present invention relates to a semiconductor package; and, more particularly, to a semiconductor package with a heat spreader capable of efficiently spreading heat generated therein.

BACKGROUND OF THE INVENTION

In a conventional package such as a plastic type package or a ball grid array ("BGA") type package, one chip is loaded in one package so that it is required to increase a size of the package in order to improve its functions. As the size of the package becomes larger, there are caused some problems such as a space utilizing problem and a heat spreading problem.

Heat generated in the package is spreaded by a heat spreader therein. In other words, the heat generated by the chip is dissipated to surroundings by the heat spreader made of a thin iron plate. However, in a chip which performs various functions, the heat may not be sufficiently spreaded merely by such heat spreader.

Further, because one chip is loaded in one package in the conventional semiconductor package, the size of the package should be increased in order to perform various functions.

As a result, in the conventional semiconductor package, the various functions thereof are not properly performed and the heat spreading is not efficiently accomplished due to a limited size of the package.

SUMMARY OF THE INVENTION

It is, therefore, an object of the present invention to provide a semiconductor package with a heat spreader capable of efficiently utilizing a space in the package and maximizing a heat spreading efficiency by loading chips to an upper part and a lower part of the package, respectively, and providing a thermally conductive member which connects a heat spreader to both of the upper and the lower chip.

In accordance with a preferred embodiment of the present invention, there is provided a semiconductor package with a heat spreader, including:

an upper PCB connected to a first chip;

a lower PCB connected to a second chip;

a heat spreader for spreading heat generated by the first chip and the second chip to surroundings; and thermally conductive members for transmitting the heat generated by the first chip and the second chip to the heat spreader by connecting the heat spreader to the first chip and the second chip.

In accordance with another preferred embodiment of the present invention, there is provided a semiconductor package with a heat spreader, including:

a lead frame connected to a first chip;

a lower PCB connected to a second chip;

a heat spreader for spreading heat generated by the first chip and the second chip to surroundings; and thermally conductive members for transmitting the heat generated by the first chip and the second chip to the heat spreader by connecting the heat spreader to the first chip and the second chip.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Figure 1:
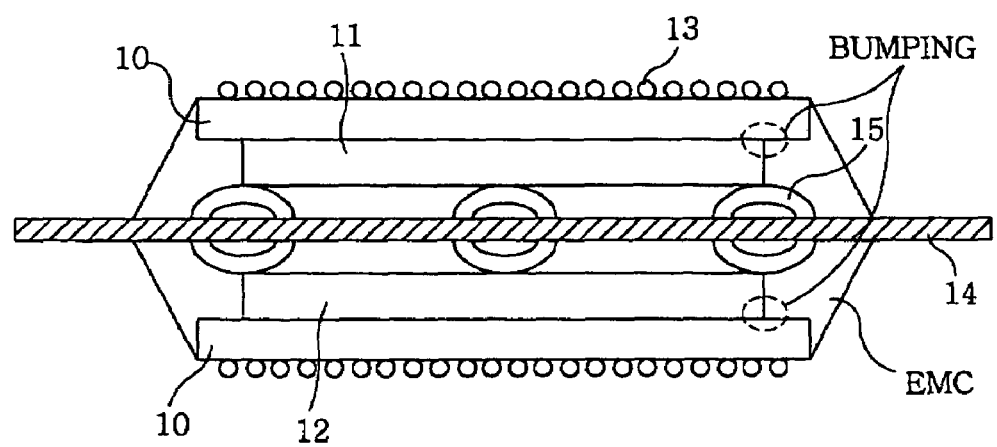
FIG. 1 illustrates a cross sectional view for showing a semiconductor package with a heat spreader in accordance with a preferred embodiment of the present invention.

A preferred embodiment of the present invention will now be described in detail with reference to the accompanying drawings, wherein like reference numerals appearing in the drawings represent like parts.

Referring to FIG. 1, a semiconductor package in accordance with the present invention includes a PCB 10, balls 13, a heat spreader 14 and thermally conductive members 15. The PCB 10 is divided into an upper PCB and a lower PCB, wherein the upper and the lower PCB are connected to an upper chip 11 and a lower chip 12 by using, e.g., gold bumps, respectively.

The heat spreader 14 functions to spread heat generated by the upper chip 11 and the lower chip 12.

The thermally conductive members 15 connect the heat spreader 14 to the upper chip 11 and the lower chip 12, thereby transmitting the heat generated by both of the upper chip 11 and the lower chip 12 to the heat spreader 14. Each of the thermally conductive members 15 may be, e.g., a disk-shaped metallic elastic body such as a disk spring and may be curved to form gaps between the heat spreader 14 and the upper chip 11 and between the heat spreader 14 and the lower chip 12.

At this time, the space in the package including the gaps is filled with epoxy mold compound ("EMC"). The heat generated by the upper chip 11 and the lower chip 12 may also be spreaded to the heat spreader 14 through the EMC.

Figure 2:
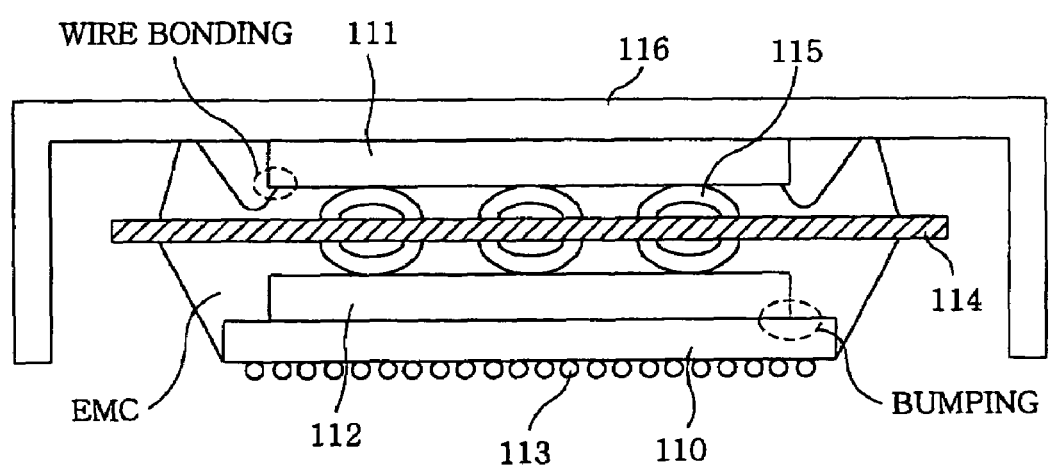
FIG. 2 depicts a cross sectional view for showing a semiconductor package with a heat spreader in accordance with another preferred embodiment of the present invention.

Referring to FIG. 2, there is shown a semiconductor package with a heat spreader in accordance with another preferred embodiment of the present invention. The semiconductor package of the second preferred embodiment includes a PCB 110, balls 113, a heat spreader 114, thermally conductive members 115 and a lead frame 116.

The PCB 110 is connected to a lower chip 112 by using, e.g., gold bumps and the lead frame 116 is connected to an upper chip 111 by, e.g., a wire bonding.

The heat spreader 114 functions to spread the heat generated by the upper chip 111 and the lower chip 112.

The thermally conductive members 115 connect the heat spreader 114 to the upper chip 111 and the lower chip 112, thereby transmitting the heat generated by both of the upper chip 111 and the lower chip 112 to the heat spreader 114. Each of the thermally conductive members 115 may be, e.g., a disk-shaped metallic elastic body such as a disk spring and may be curved to form gaps between the heat spreader 114 and the upper chip 111 and between the heat spreader 114 and the lower chip 112. Also, the space in the package including the gaps is filled with the EMC.

In accordance with the present invention, the semiconductor package can maximize its functions and extend a life time thereof by efficiently spreading the heat generated therein while maintaining its size unchanged.

While the invention has been shown and described with respect to the preferred embodiments, it will be understood by those skilled in the art that various changes and modifications may be made without departing from the spirit and scope of the invention as defined in the following claims.

What is claimed is:

1. A semiconductor package with a heat spreader, comprising:
    an upper PCB connected to a first chip;
    a lower PCB connected to a second chip;
    a heat spreader for spreading heat generated by the first chip and the second chip to surroundings; and
    thermally conductive members for transmitting the heat generated by the first chip and the second chip to the heat spreader by connecting the heat spreader to the first chip and the second chip wherein the heat spreader is positioned between the first and second chips.

2. The semiconductor package of claim 1, wherein the thermally conductive members are curved to form gaps between the heat spreader and the first chip and between the heat spreader and the second chip.

3. The semiconductor package of claim 1, wherein a space in the semiconductor package is filled with epoxy mold compound ("EMC").

4. The semiconductor package of claim 1, wherein the thermally conductive members are disk-shaped metallic elastic bodies.

5. The semiconductor package of claim 4, wherein the thermally conductive members are disk springs.

6. A semiconductor package with a heat spreader, comprising:
    a lead frame connected to a first chip;
    a lower PCB connected to a second chip;
    a heat spreader for spreading heat generated by the first chip and the second chip to surroundings; and
    thermally conductive members for transmitting the heat generated by the first chip and the second chip to the heat spreader by connecting the heat spreader to the first chip and the second chip wherein the heat spreader is positioned between the first and second chips.

7. The semiconductor package of claim 6, wherein the thermally conductive members are curved to form gaps between the heat spreader and the first chip and between the heat spreader and the second chip.

8. The semiconductor package of claim 6, wherein a space in the semiconductor package is filled with epoxy mold compound ("EMC").

9. The semiconductor package of claim 6, wherein the thermally conductive members are disk-shaped metallic elastic bodies.

10. The semiconductor package of claim 9, wherein the thermally conductive members are disk springs.

* * * * *